(12) United States Patent  (10) Patent No.: US 7,635,642 B2
Chai  (45) Date of Patent: Dec. 22, 2009

(54) INTEGRATED CIRCUIT PACKAGE AND METHOD FOR PRODUCING IT

(75) Inventor: Fui Jin Chai, Singapore (SG)

(73) Assignee: Infineon Technologies AG, Munich (DE)

( * ) Notice: Subject to any disclaimer, the term of this patent is extended or adjusted under 35 U.S.C. 154(b) by 457 days.

(21) Appl. No.: 10/547,271

(22) PCT Filed: Feb. 27, 2003

(86) PCT No.: PCT/SG03/00042

§ 371 (c)(1),
(2), (4) Date: Jun. 5, 2006

(87) PCT Pub. No.: WO2004/077559

PCT Pub. Date: Sep. 10, 2004

(65) Prior Publication Data

US 2006/0240592 A1  Oct. 26, 2006

(51) Int. Cl.
*H01L 21/44* (2006.01)

(52) U.S. Cl. .................................................... 438/613

(58) Field of Classification Search .................. None
See application file for complete search history.

(56) References Cited

U.S. PATENT DOCUMENTS 4,720,324 A * 1/1988 Hayward ..................... 216/18
5,783,870 A * 7/1998 Mostafazadeh et al. ..... 257/791
6,258,626 B1   7/2001 Wang et al.
6,329,711 B1  12/2001 Kawahara et al.
6,713,854 B1 *  3/2004 Kledzik et al. .............. 257/686

FOREIGN PATENT DOCUMENTS

| EP | 0 915 505 A1 | 5/1999 |
| EP | 0 977 259 A2 | 2/2000 |
| EP | 1 045 443 A2 | 10/2000 |
| EP | 1 122 778 A2 | 8/2001 |

* cited by examiner

*Primary Examiner*—Charles D Garber
*Assistant Examiner*—Andre' C Stevenson

(57) ABSTRACT

An integrated circuit includes a first integrated circuit flip chip (105, 205, 305) is bonded to first electric contacts (102, 202, 302) which are an inner part (104, 204, 304) of a planar array (103, 203, 303) of electric contacts. Second electric contacts (106, 206, 306) on the flip chip are in register with the first electric contacts (102, 202, 302) of this inner part of the array. A second integrated circuit (108, 208, 308) is mounted on the face of the flip chip (105, 205, 305) opposite the array. The second integrated circuit (108, 208, 308) has third electric contacts (109, 209, 309) facing away from the flip chip (105, 205, 305). Wire bonds (112, 212, 312) are formed between the third electric contacts of the second integrated circuit (108, 208, 308) and others of the array of first electric contacts (102, 202, 302). The first and second integrated circuits are sealed in a resin body (110, 210, 310). The first electric contacts are ends of electrical paths extending perpendicular to the faces of the integrated circuit to a corresponding array of contacts on the lower surface of the package.

20 Claims, 7 Drawing Sheets

INTEGRATED CIRCUIT PACKAGE AND METHOD FOR PRODUCING IT

FIELD OF THE INVENTION

The present invention relates to packaging of integrated circuits, and to an integrated circuit package.

BACKGROUND OF INVENTION

It is well known to package integrated circuits (dies) by placing them on a die-pad area of a lead frame with their electric contacts facing away from the lead frame. Wire bonds are formed between electric contacts of the die and lead fingers of the frame, a resin body is moulded around the integrated circuit and wires, and then the dam-bars are cut to separate each lead finger before singulation. This produces a "leaded" package, that is one having leads protruding from the sides.

An alternative to leaded packages where the lead frame is the carrier is the TAPP (thin array plastic package) packaging method, in which the integrated circuit is wire bonded to an array of electrical contacts supported on the surface of a laminar element. An integrated circuit it put onto the laminar element, and its electrical contacts are wire bonded to the respective electrical contacts supported by the substrate. Then the integrated circuit and wire bonds are encapsulated in an encapsulant, and the laminar element is removed by etching.

Another alternative to leaded packages where the lead frame is the carrier are BGA (ball grid array) packages. In one known BGA technique, the integrated circuit is mounted on the upper face of a laminar substrate, with the contacts of the integrated circuit facing away from the substrate. Wire bonds are formed to connect the electric contacts on the integrated circuit to contact points on the substrate. The electric contact points on the substrate are laterally spaced from the integrated circuit (i.e. to the sides of the integrated circuit), and in contact with respective electric paths which lead through the substrate to bumps on the substrate's lower surface. The substrate includes internal electrical paths parallel to the plane of the integrated circuit, so that the pattern of bumps is not the same as the pattern of the electric contact points on the substrate. The integrated circuit is then encased in plastic resin.

Another known leadless technique is known as the BCC (bump chip carrier) technique. In this case, an integrated circuit is placed onto a surface with its electric contacts facing upward. Areas of the surface to the sides of the integrated circuits include multiple depressions and a layer of conductive material is deposited over the surface. Wire bonding is used to directly connect contacts on an upper side of an integrated circuit to the portions of conductive material in the depressions. Resin is applied to encase the integrated circuit and the wires, and then the substrate is removed. Portions of the conductive layer between the depressions are selectively removed by an etching technique, so that the lower surface of the package is composed of the resin layer and protruding from it electrically conductive bumps which are the remains of the conductive material in the depressions. The bumps are laterally spaced from the footprint of the integrated circuit, i.e. there are no bumps directly beneath the integrated circuit.

There is continuing pressure to increase the number of inputs and outputs of the integrated circuit without increasing its size. One technique which has been proposed to achieve this is to mount a first integrated circuit on a lead frame, and a second integrated circuit onto the first. Both the integrated circuits are connected by wire bonds to the leadframe.

A further known packaging technique employs a integrated circuit called a flip chip. The flip chip carries electric contacts on one of its major surfaces, and this surface is placed attached face-to-face with a surface of a substrate having an organic laminate or inorganic laminate structure. The electric contacts of the flip chip are connected by solder bumps to circuitry which extends through the structure.

SUMMARY OF THE INVENTION

The present invention aims to provide a new and useful method for packaging integrated circuits, and packaged integrated circuits produced by the method.

In general terms, the invention proposes that a first integrated circuit flip chip is bonded to electric contacts ("first electric contacts") which are part of a planar array of electric contacts. The electric contacts on the flip chip ("second electric contacts") are in register with the corresponding first electric contacts. Then, a second integrated circuit is mounted on the face of the flip chip opposite the array, with its electric contacts ("third electric contacts") facing away from the flip chip. Wire bonds are formed between the third electric contacts of the second integrated circuit and others of the first electric contacts. The first and second integrated circuits are then sealed in resin. The first electric contacts are parts of electric paths extending perpendicular to the major faces of the substrate to give an array of contacts on the lower surface of the package substantially identical in size and arrangement to the array of first electric contacts.

Thus, in comparison to the known packages discussed above the number of I/Os is higher, and the computing power of the package is higher, without the footprint of the package being larger. The package is "fully populated" (i.e. a high proportion of its lower surface consists of electrodes), and "non-leaded" (i.e. there are no leads projecting laterally). Also, no lateral paths within a laminated substrate are required, as in the BGA technique.

In a first case, the first electric contacts may be formed as an array of separate electrically conductive elements on the surface of a substrate. The substrate is removed after the integrated circuits have been attached to the contacts and encased in resin. This technique can be implemented in a way similar to the TAPP technique described above.

In a second case, the first electric contacts are initially portions of a continuous layer, and after the resin is applied the layer is then selectively removed to isolate the first electric contacts.

In this second case, the first electric contacts may be portions of a continuous layer which are shaped so as to flex in the direction away from the flip chip. Thus, when the other portions of the conductive layer are removed, the first electric contacts are bumps shaped so as to flex away from the integrated circuits. This technique can be implemented analogously to the BCC (bump chip carrier) technique mentioned above.

In a third case, the first electric contacts are part of a carrier which is a laminar substrate of insulating material. The laminar substrate includes an array of electric paths extending directly through the substrate between its two opposite major faces. The first electric contacts are the ends of these electric paths on one surface of the substrate.

Note that such a carrier is not known in existing technology, and constitutes an independent aspect of the invention. In other words, while it is preferable for a carrier of this kind to be used to carry two integrated circuits in the manner described above, the invention is not limited in this respect. Instead, the carrier may be used to carry only a single integrated circuit. For example, a single integrated circuit can be connected to a central portion of one of the major faces of the carrier and wire bonded to an appropriate subset of the first electric contacts of the carrier. Then the integrated circuit and wire bonds can be encased in resin to complete the package.

The carrier proposed by this invention is therefore highly versatile, since it can be used for any of a wide range of integrated circuits, each using a different subset of its first electrical contacts. This gives it an advantage compared to conventional lead frames which are normally only suitable for a single type of integrated circuit.

Furthermore, the proposed carrier can give the advantages of leadframe packages: excellent thermal performance, low inductance and low cost.

Furthermore, in contrast to the TAPP technique described above, no step of removing the substrate is required, since the laminar substrate which is part of the present carrier remains within the completed package.

BRIEF DESCRIPTION OF THE FIGURES

Preferred features of the invention will now be described, for the sake of illustration only, with reference to the following figures in which:

FIG. 1, which is composed of FIGS. 1(a) to 1(f), shows the steps in a method which is a first embodiment of the invention;

FIG. 2, which is composed of FIGS. 2(a) to 2(e), shows the steps in a method which is a second embodiment of the invention; and FIG. 3, which is composed of FIGS. 3(a) to 3(h), shows the steps in a method which is a third embodiment of the invention.

DETAILED DESCRIPTION OF THE EMBODIMENTS

Referring firstly to FIG. 1, the steps in the formation of a first embodiment of the invention are shown. Firstly, as shown in cross section in FIG. 1(a), a number of first electric contacts 102 are formed on the upper surface of a laminar substrate 101. The first contacts 102 can be performed by a plating step. A top view of the substrate is shown in FIG. 1(b) showing that the first electric contacts 102 are positioned in an array 103, having a central portion 104.

Figure 1A:
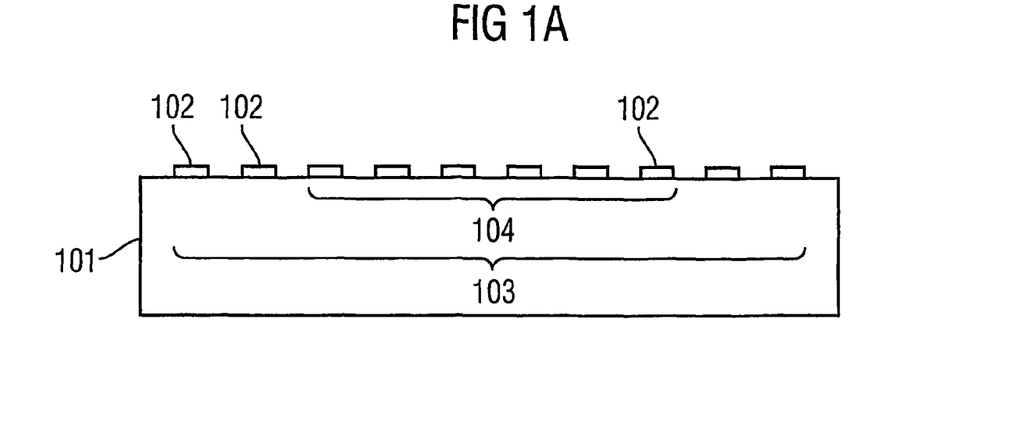
Figure 1B:
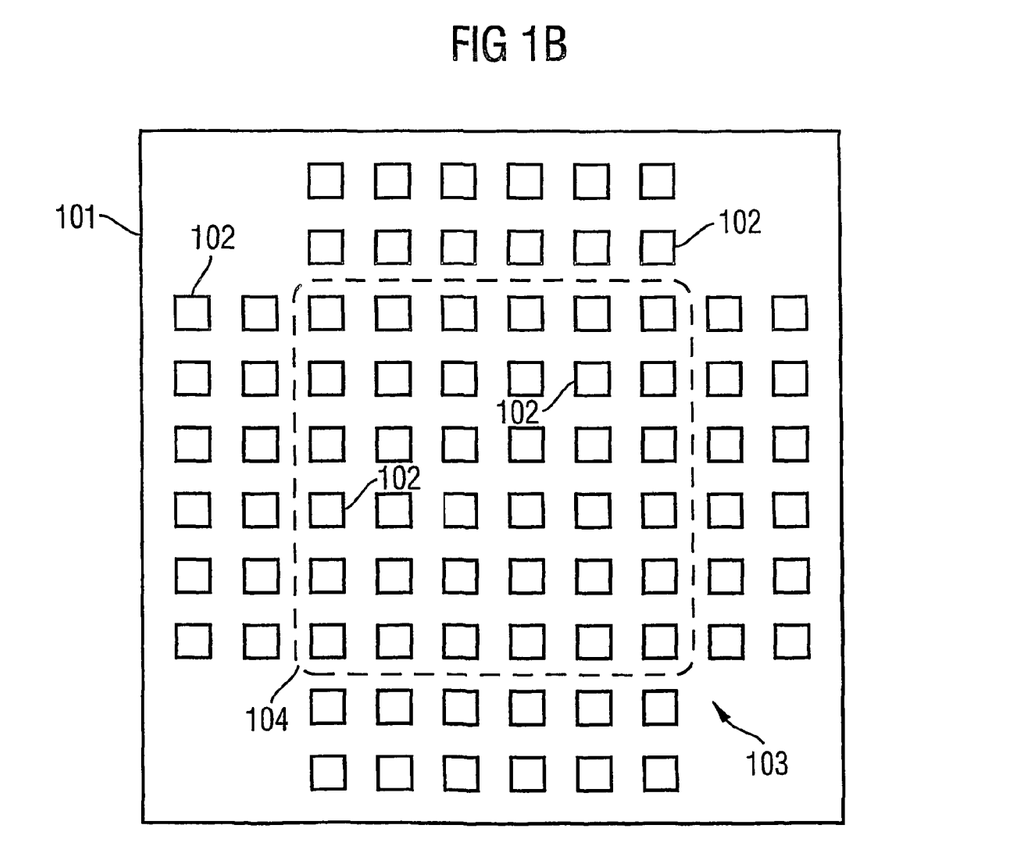
Figure 1C:
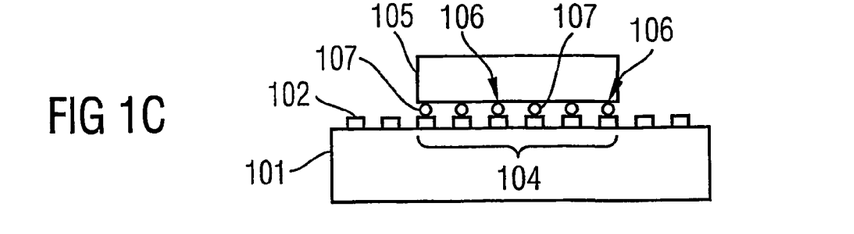

As shown in cross section in FIG. 1(c), a flip chip 105 is bonded to the first electric contacts 102. The flip chip 105 has second electric contacts 106 on a major surface of the flip chip 105 which faces the substrate 101. The second electric contacts 106 are in an array such that the second electric contacts 106 of the flip chip 104 correspond in position to respective first electric contacts 102 in the central part 104 of the array 103. Corresponding second electric contacts 106 and first electric contacts 102 are electrically and mechanically bonded together by solder bumps 107, as in a conventional flip chip bonding operation. After the bonding, the second electric contacts 106 are fixed in register with the corresponding first electric contacts 102 of the central part 104 of the array 103.

Figure 1D:
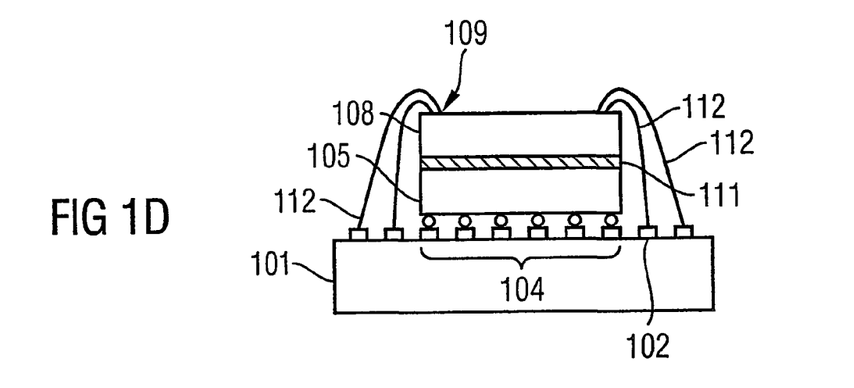
Figure 1E:
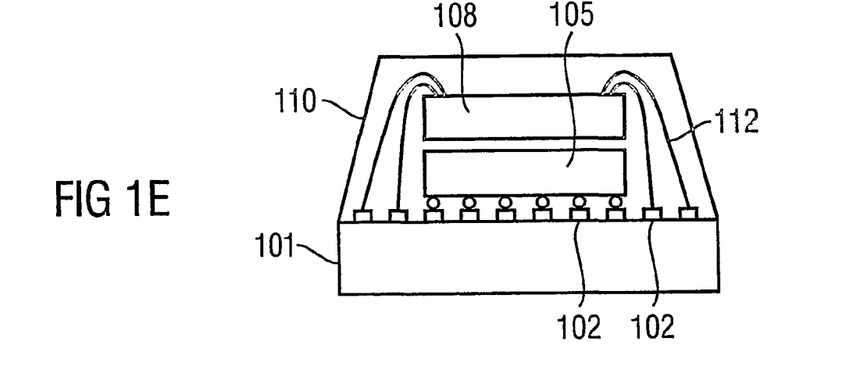

Subsequently, as shown in FIG. 1(d), a second integrated circuit 108 is mounted on the surface of the flip chip 105 facing away from the substrate 101. An adhesive layer 111 is provided to join the integrated circuits 105, 108 together. Third electric contacts 109 on the top surface of the second integrated circuit 108 facing away from the flip chip 105 are connected by wire bonds 112 to respective first electric contacts 102 outside the central part 104 of the array 103. These connections are preferably to all four sides of the central portion 104 of the array 103 as shown in FIG. 1(a).

Subsequently, a resin body 110 is encapsulated around the two integrated circuits 105, 108 using a known encapsulation technique, in which the structure shown in FIG. 1(d) is encapsulated with an encapsulant. The space between the flip chip 105 and the substrate 101 is filled with the encapsulant.

Figure 1F:
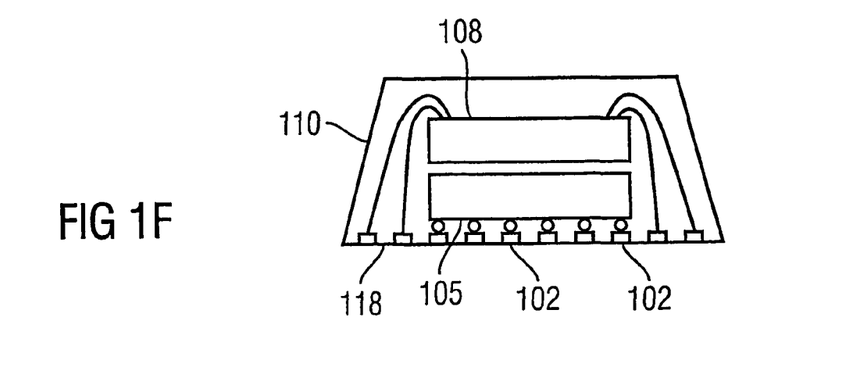

The substrate 101 is then removed, thereby completing the packaging. The completed package is shown in cross-section in FIG. 1(f). The finished package has a square or rectangular face 118 (the lower face as seen in FIG. 1(f) with first electric contacts 102 in the same array shown in FIG. 1(b). That is, the array of first electric contacts 102 is "fully populated", i.e. it covers substantially all of the lower surface 118 of the package apart from land regions between the first electric contacts 102 (and optionally also at the corners of the face 118).

Turning to FIG. 2, the steps in the formation of a second embodiment of the invention are shown. This embodiment employs a carrier mainly composed of a laminar substrate 201 shown in cross section in FIG. 2(a). A number of first electric contacts 202 are formed in the top surface of the substrate 201 as the top end of conductive paths 282 extending through the substrate 201 from one face to the other. These paths 282 are shown hashed in FIG. 2(a). A top view of the substrate is shown in FIG. 2(b) showing that the electric contacts are positioned in an array 203, having a central portion 204.

Figure 2A:
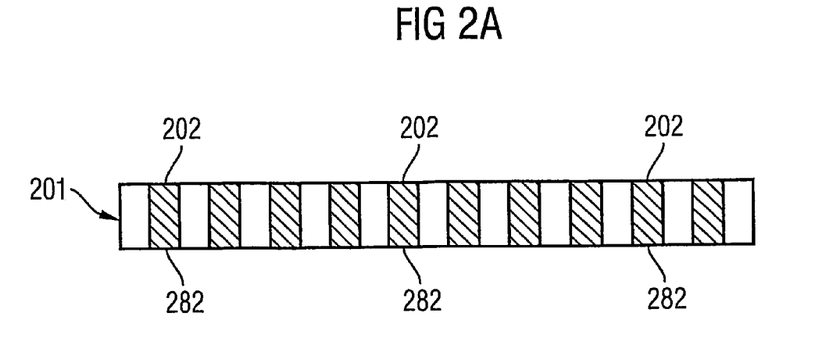
Figure 2B:
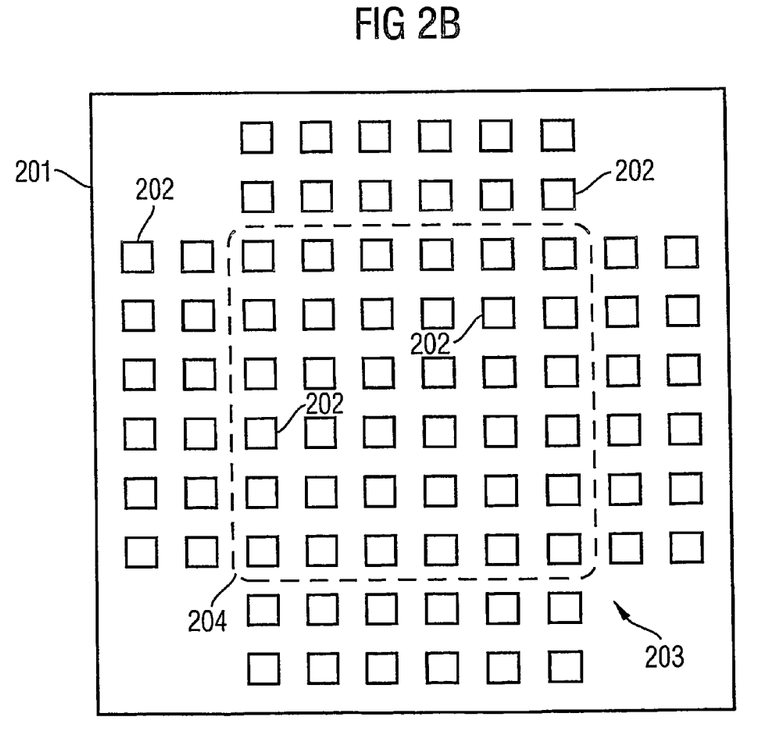
Figure 2C:
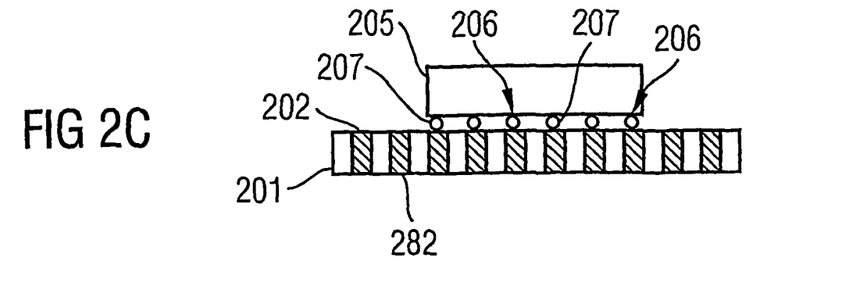

As shown in cross section in FIG. 2(c), a flip chip 205 is bonded to the substrate 201. The flip chip 205 has second electric contacts 206 on a major surface of the flip chip 205 which faces the substrate 201. The second electric contacts 206 are in an array such that the second electric contacts 206 of the flip chip 205 correspond in position to respective first electric contacts 202 in the central part 204 of the array 203. Corresponding first electric contacts 206 and second electric contacts 202 are electrically and mechanically bonded together by solder bumps 207, as in a conventional flip chip bonding operation. After the bonding, the second electric contacts 206 are fixed in register with the corresponding first electric contacts 202 of the central part 204 of the array 203.

Figure 2D:
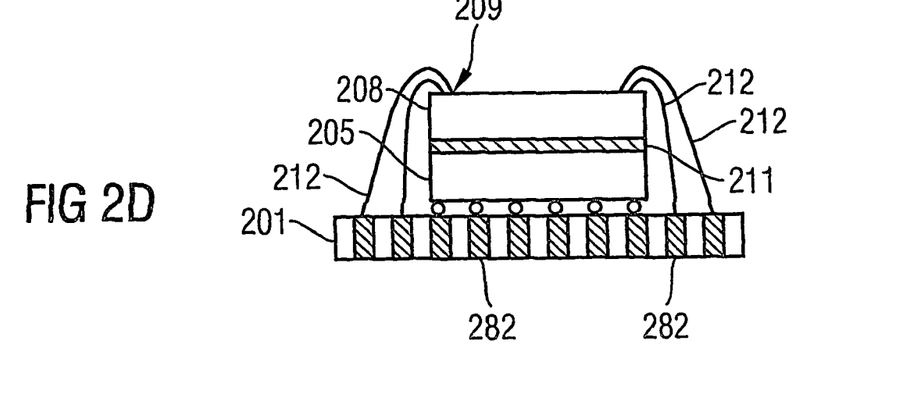

Subsequently, as shown in FIG. 2(d), a second integrated circuit 208 is mounted on the surface of the flip chip 205 facing away from the substrate 201. An adhesive layer 211 is provided to join the integrated circuits 205, 208 together. Third electric contacts 209 on the surface of the integrated circuit 208 facing away from the flip chip 205 are connected by wire bonds 212 to respective first electric contacts 202 outside the central part 204 of the array 203.

Figure 2E:
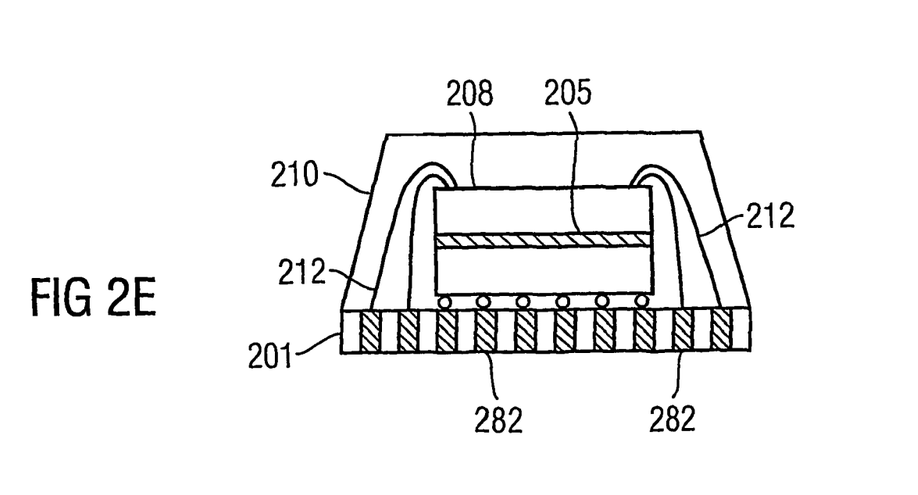

Subsequently, a resin body 210 is encapsulated around the two integrated circuits 205, 208 using a known encapsulation technique, in which the structure shown in FIG. 2(d) is encapsulated with an encapsulant. The space between the flip chip 205 and the substrate 201 is filled with the encapsulant. This completes the packaging, so the completed package is shown in cross-section in FIG. 2(e). The finished package has a square or rectangular face 218 (the lower face as seen in FIG. 2(e)) with first electric contacts in the same array shown in FIG. 2(b). That is, an array of electric contacts which is "fully populated".

A carrier as shown in FIGS. 2(a) and 2(b) may be formed for example by a method which takes as its starting point the structure shown in FIGS. 1(a) and 1(b). A layer of a liquid insulating material can be formed over the surface of the substrate 103 and then solidified (e.g. cured) to form a solid insulting layer with a thickness equal to the height of the elements 102. The substrate 101 can then be removed.

Turning to FIG. 3, the steps in the formation of a third embodiment of the invention are shown. This embodiment employs a substrate 301 shown in cross section in FIG. 3(*a*), having a number of circular depressions 313. A top view of the substrate is shown in FIG. 3(*b*) showing that the circular depressions 313 are positioned in an array 303, having a central portion 304.

Figure 3A:
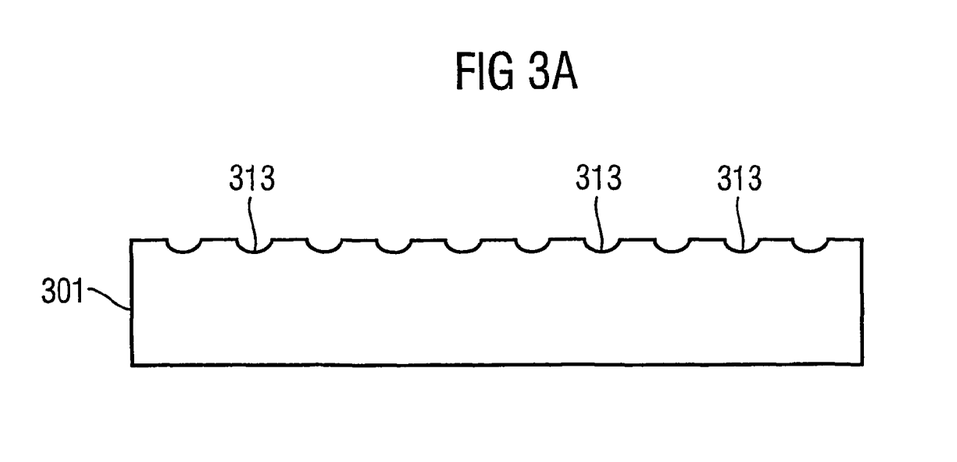
Figure 3B:
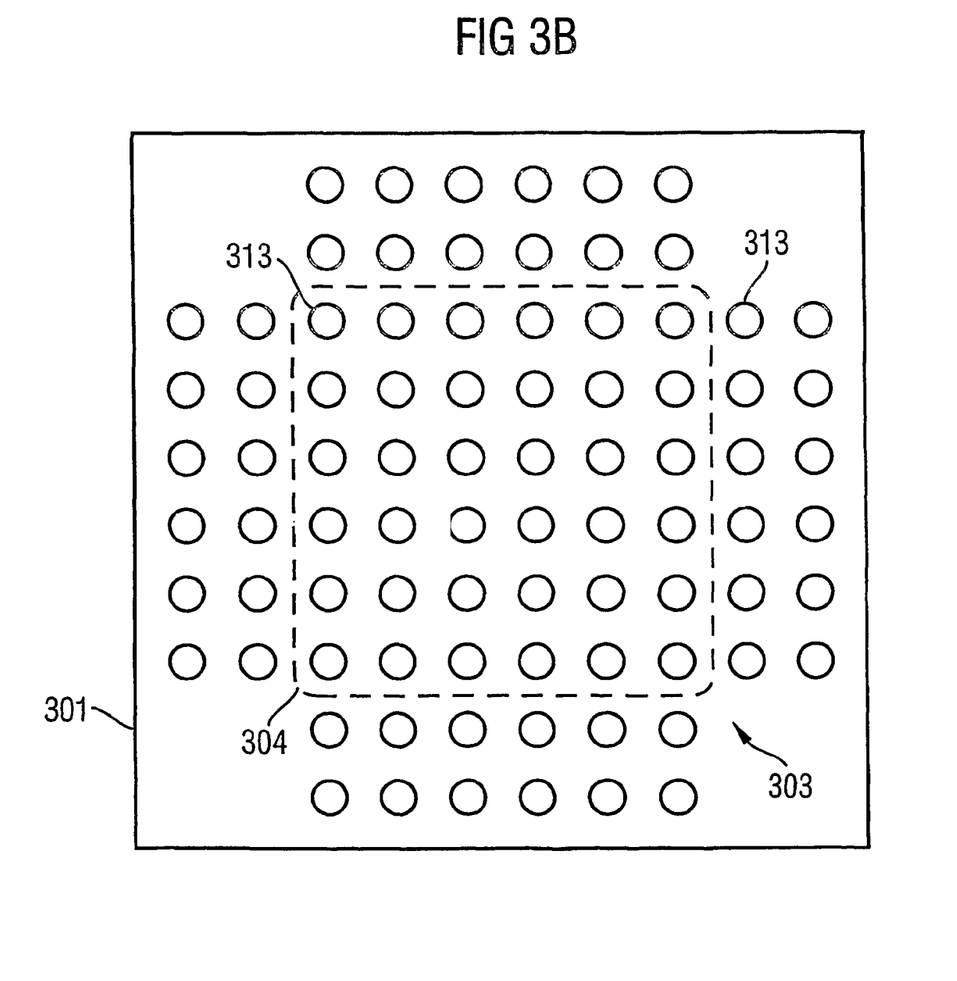
Figure 3C:
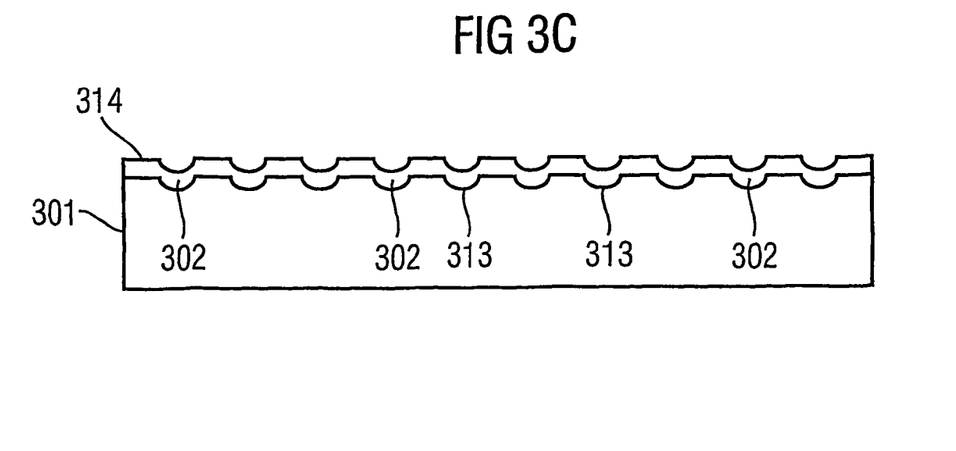
Figure 3D:
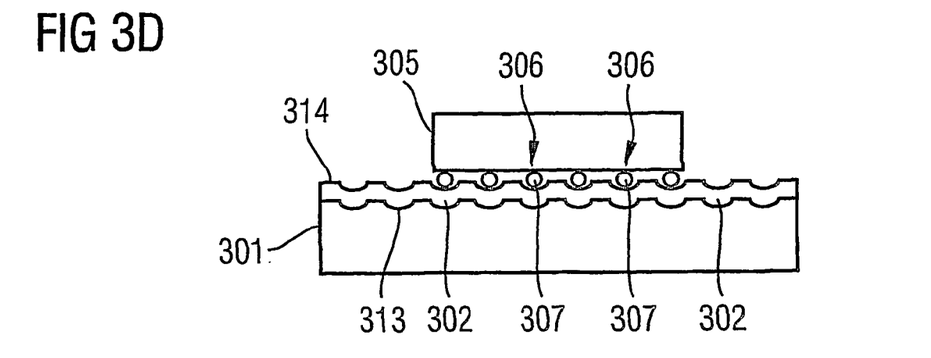

A conductive layer 314 is formed on the upper surface of the substrate 301 having uniform thickness, so that the portions 302 of the layer 314 (which will later become the first electric contacts) overlying the depressions 313 are shaped so as to flex in the downward direction as shown in the cross-sectional view of FIG. 3(*c*).

Then, as shown in cross section in FIG. 3(*d*), a flip chip 305 is bonded to the substrate 301. The flip chip 305 has second electric contacts 306 on a major surface of the flip chip 305 which faces the substrate 301. The second electric contacts 306 are in an array such that the second electric contacts 306 of the flip chip 304 correspond in position to respective flexed portions 302 in the central part 304 of the array 303. Corresponding second electric contacts 306 and flexed portions 302 are electrically and mechanically bonded together by solder bumps 307, as in a conventional flip chip bonding operation. After the bonding, the second electric contacts 306 are fixed in register with the corresponding flexed portions 302 of the central part 304 of the array 303.

Subsequently, as shown in FIG. 3(*e*), a second integrated circuit 308 is mounted on the top surface of the flip chip 305 facing away from the substrate 301. An adhesive layer 311 is provided to join the integrated circuits 305, 308 together. Third electric contacts 309 on the surface of the integrated circuit 308 facing away from the flip chip 305 are connected by respective wire bonds 312 to respective flexed portions 302 outside the central part 304 of the array 303.

Figure 3E:
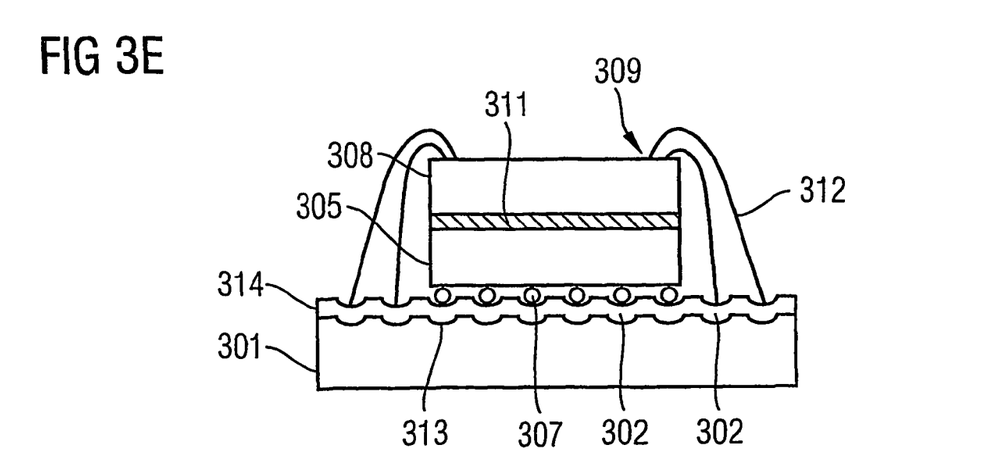
Figure 3F:
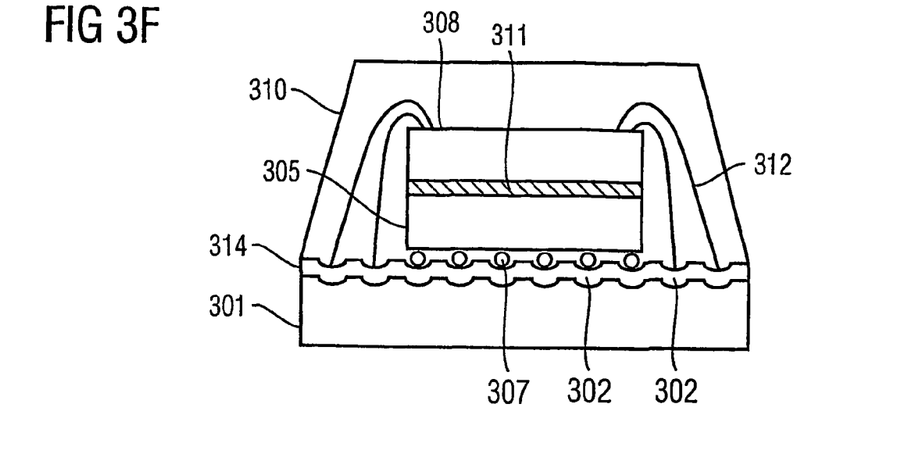
Figure 3G:
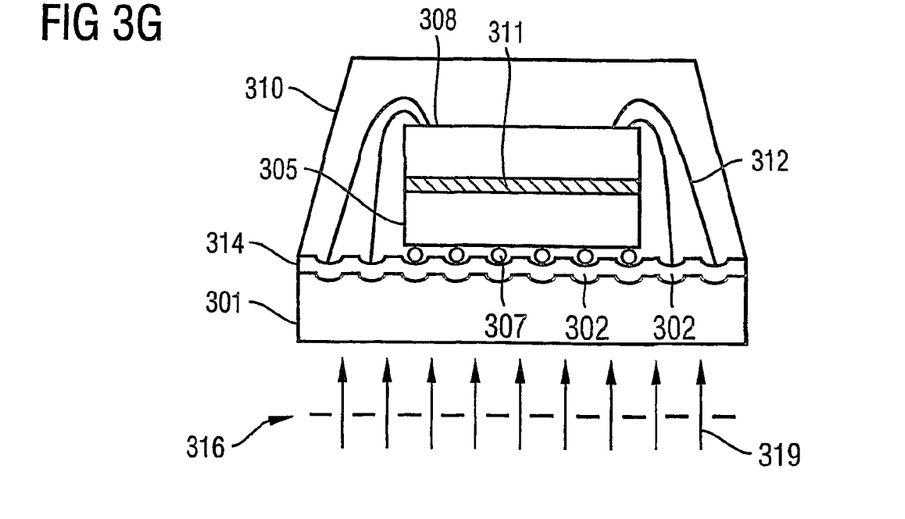
Figure 3H:
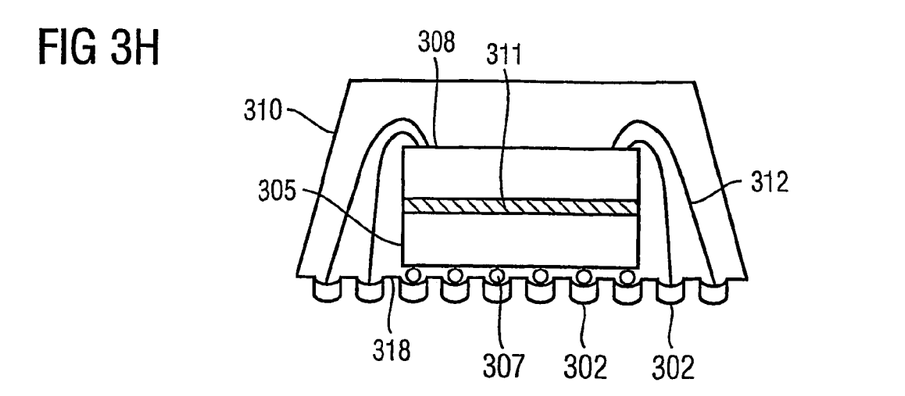

Subsequently, a resin body 310 is encapsulated around the two integrated circuits 305, 308 using a known encapsulation step, in which the structure shown in FIG. 3(*e*) is encapsulated with an encapsulant, to form the structure shown in FIG. 3(*f*). The space between the flip chip 305 and the layer 314 is filled with the encapsulant.

Then, as shown in FIG. 3(*g*), the lower surface of the structure shown in FIG. 3(*f*) is subjected to an etching process using an etchant 319 which removes the whole of the substrate 301 and all of the layer 314 except the flexed portions 302, which are protected by a mask 316, thereby transforming the flexed portions 302 into lead bumps 302.

The completed package is shown in cross-section in FIG. 3(*h*). The finished package has a square or rectangular face 318 (the lower face as seen in FIG. 3(*h*)) with lead bumps 302 extending from it in the same array shown in FIG. 3(*b*). That is, an array of electric contacts 302 which is fully populated, i.e. covering substantially all of the lower surface of the package apart from land regions between the lead bumps 302 (and optionally also at the corners of the face 318).

Although only three embodiments of the invention have been described, many variations are possible within the scope of the invention as will be clear to a skilled reader. For example, although in the embodiments described above the first electric contacts 102, 202 and lead elements 302 are portions of the same regular array 103, 203, 303 (i.e. with the contacts 102, the contacts 202 and lead elements 302 all having the same respective spacing throughout the arrays), the array may be significantly different, for example having a different spacing for the inner portions 104, 204, 304 of the array 103 compared to the spacing in the outer portions.

Furthermore, in principle a further possibility within the scope of the invention would be for the array of first electric contacts to which the integrated circuits are joined to be actually part of a printed circuit board, so that the first and second integrated circuits would be bonded directly to the board. However, this possibility is not presently preferred for the same reasons for which integrated circuits are not conventionally bonded directly to printed circuit boards: in the case that there is some problem with the integrated circuits' operation the entire printed circuit board may become unusable.

A further important possibility within the scope of the invention is for the carrier 201 shown in FIGS. 2(*a*) and 2(*b*) to be used other than as shown in FIG. 2(*c*) to FIG. 2(*e*). For example, it is possible within the scope of the invention for only a single integrated circuit to be attached to the carrier 201. This may be an integrated circuit 205 of the form having electrical contacts on its surface facing the carrier 201, or alternatively an integrated circuit 208 of the kind having electric contacts on its surface facing away from the substrate. In the case that the carrier 201 is only to be used for mounting integrated circuits such as integrated circuit 208, optionally the electric contacts 202 within a central portion 204 of the carrier surface may be omitted to give a die pad portion. However, more preferably, this array of electric contacts 202 includes also electric contacts 202 in the central portion 208, as shown in FIGS. 2(*a*) and 2(*b*), and an appropriate selection of the electric contacts 202 are used according to which type(s) of integrated circuit are being packages.

The invention claimed is:

1. A method of forming an integrated circuit package, the method comprising:
   (i) providing an array of first electric contacts;
   (ii) locating a first integrated circuit having a surface including second electric contacts with the surface facing the array of first electric contacts, and bonding the second electric contacts to respective ones of the first electric contacts, wherein the first integrated circuit comprises a flip chip;
   (iii) mounting a second integrated circuit on a face of the first integrated circuit which faces away from the array such that the first and second integrated circuits are joined together, the second integrated circuit including third electric contacts on a surface facing away from the first integrated circuit;
   (iv) forming wire bonds between respective first electric contacts and respective third electric contacts;
   (v) forming a resin body enclosing the first and second integrated circuits and the wire bonds; and
   (vi) via the first electric contacts, providing ends of electrical paths extending perpendicular to the surface of the first integrated circuit at least to a surface of the integrated circuit package.

2. A method according to claim 1, wherein the first electric contacts are formed as respective parts of a first major surface of a laminar substrate, the substrate including electric paths extending through the substrate to its other major surface.

3. A method according to claim 2, wherein step (i) includes plating the first electric contacts onto a laminar substrate.

4. A method according to claim 1, wherein step (i) further comprises providing the first electric contacts on a first surface of a laminar substrate, and further comprising a step of removing the laminar substrate.

5. A method according to claim 4, wherein step (i) further comprises providing the first electric contacts as portions of a conductive layer in the laminar substrate, and further comprising a step of removing portions of the conductive layer to singulate the second electric contacts.

6. A method according to claim 5, wherein the substrate includes depressions in its first surface, the first electric contacts being portions of the conductive layer which overlie the depressions, and wherein removing the portions of the conductive layer to singulate the second electric contacts comprises providing second electric leads having a shape which flexes in a direction away from the first and second integrated circuits.

7. A method according to claim 1, wherein step (ii) includes bonding the first integrated circuit directly to a circuit board and step (iv) includes bonding the second integrated circuit directly to the circuit board.

8. A method according to claim 1, wherein step (vi) further comprises etching a structure to provide ends of electrical paths extending perpendicular at least to the surface of the first integrated circuit using the first electrical contacts.

9. An integrated circuit package comprising:
a planar array of first electric contacts;
a first integrated circuit which has a surface facing the array of first electric contacts and including second electric contacts in register with and bonded to respective ones of the first electric contacts, wherein the first integrated circuit comprises a flip chip;
a second integrated circuit on a face of the first integrated circuit which faces away from the array such that the first and second integrated circuits are joined together, the second integrated circuit including third electric contacts on a surface facing away from the first integrated circuit;
wire bonds between respective first electric contacts and respective third electric contacts; and
a resin body enclosing the first and second integrated circuits and the wire bonds, wherein the first electric contacts are ends of electrical paths extending perpendicular to the surface of the first integrated circuit at least to a surface of the integrated circuit package.

10. A package according to claim 9, further comprising:
a laminar substrate including a first surface, a second surface and electrical paths extending from the first surface to the second surface, and wherein the first electric contacts are formed as respective parts of the first surface.

11. A package according to claim 9, wherein the first electric contacts are an array of separate electrically conductive elements held in position by the resin body.

12. A package according to claim 11, wherein the first electric contacts are curved to flex in a direction away from the first integrated circuit.

13. A package according to claim 9, wherein the array includes a central portion and the first electric contacts that are bonded to the second electric contacts are located in the central portion of the array.

14. A package according to claim 13, wherein the first electric contacts that are bonded to the third electric contacts are located outside the central portion of the array.

15. A package according to claim 14, wherein the first electric contacts bonded to the third electric contacts are located about four sides of the central portion of the array.

16. A package according to claim 9, wherein the array of contacts on the surface of the integrated circuit package covers substantially all of the surface of the integrated circuit package.

17. A carrier for forming an integrated circuit package, the carrier comprising:
a laminar substrate of insulating material and an array of electrical paths extending through the substrate transverse to major surfaces of the substrate, ends of the electrical paths terminating on a first major surface of the substrate and constituting first electric contacts, wherein the array of electrical paths includes electrical paths terminating at a central portion of the first major surface of the substrate;
the first major surface configured to receive an integrated circuit having electrical contacts, the electrical contacts of the integrated circuit connected to selected respective first electric contacts.

18. A method of forming an integrated circuit package, the method comprising:
providing an array of first electric contacts on a first surface of a laminar substrate;
locating a first integrated circuit having a surface including second electric contacts with the surface facing the array of first electric contacts, and bonding the second electric contacts to respective ones of the first electric contacts;
mounting a second integrated circuit on a face of the first integrated circuit which faces away from the array, the second integrated circuit having a surface facing away from the first integrated circuit and including third electric contacts;
forming wire bonds between respective first electric contacts and respective third electric contacts;
forming a resin body enclosing the first and second integrated circuits and the wire bonds;
removing the laminar substrate; and
via the first electric contacts, providing ends of electrical paths extending perpendicular to the surface of the first integrated circuit at least to a surface of the integrated circuit package.

19. A method according to claim 18, wherein the step of providing an array of first electric contacts further comprises providing the first electric contacts as portions of a conductive layer in the laminar substrate, and further comprising a step of removing portions of the conductive layer to singulate the second electric contacts.

20. A method according to claim 19, wherein the substrate includes depressions in its first surface, the first electric contacts being portions of the conductive layer which overlie the depressions, and wherein removing the portions of the conductive layer to singulate the second electric contacts comprises providing second electric leads having a shape which flexes in a direction away from the first and second integrated circuits.

* * * * *